United States Patent [19]

Doung et al.

[11] Patent Number: 4,667,312
[45] Date of Patent: May 19, 1987

[54] CHARGE PUMP METHOD AND APPARATUS

[75] Inventors: Cheen P. Doung, Cupertino; Anil Gupta, Sunnyvale, both of Calif.

[73] Assignee: Exel Microelectronics Inc., San Jose, Calif.

[21] Appl. No.: 555,698

[22] Filed: Nov. 28, 1983

[51] Int. Cl.[4] .............................................. G11C 13/00
[52] U.S. Cl. .................................... 365/189; 365/203; 365/45
[58] Field of Search .................. 365/45, 203, 189, 230

[56] References Cited

U.S. PATENT DOCUMENTS

2,787,418  4/1957  MacKnight ........................... 365/45

Primary Examiner—Terrell W. Fears
Attorney, Agent, or Firm—Limbach, Limbach & Sutton

[57] ABSTRACT

A method and apparatus for transferring a signal from a high voltage, low current source to a word select line in an electrically erasable, programmable read-only memory wherein a control signal is generated which is incremented in magnitude over time, the control signal being used to control a signal path between the high voltage, low current source and the desired word select line, such that the signal path is established whenever the difference between the control signal and the signal level on the word select line exceeds a predetermined threshold level, whereby the signal level on the desired word select line increases gradually over time to the high voltage level.

18 Claims, 5 Drawing Figures

CHARGE PUMP METHOD AND APPARATUS

TECHNICAL FIELD

The present invention is directed, generally, to a method and apparatus for controlling the application of a high voltage signal to a load from a high voltage, low current source, and more particularly to a charge pump by which the application of an internally generated write or erase voltage within an electrically erasable programmable read-only memory can be controlled so that only selected word lines receive the internally high voltage signal.

BACKGROUND ART

As is well known in the electrically erasable programmable read-only memory (EEPROM) art, the erasing and writing operations within an EEPROM require a voltage which is larger than that required for the read operation. During a write or erase operation, the Fowler-Nordheim effect is utilized to cause electrons to tunnel through a thin oxide layer and to be stored on the floating gate of the memory cell, in the case of an erase operation; or to be depleted from the floating gate, in the case of a write operation to a logic zero. A voltage of between 20 and 25 volts is required to produce the Fowler-Nordheim effect.

In early EEPROM devices, an external high voltage source was required to provide the high voltage level for writing and erasing. These high voltage sources typically took the form of a separate, external high voltage power source, or some form of step-up circuitry.

More recently, voltage multipliers have been built into the EEPROM devices by which the nominal supply voltage, Vcc, is multiplied up to the required internal high voltage level, Vpp. These internal voltage multipliers typically comprise a chain of diode/capacitor combinations which rectify some periodic pulsewave form and additively accumulate the rectified voltages. One limitation of such internal high voltage generators is that the maximum current typically available therefrom is approximately 10 microamps. This presents a severe limitation on permissible current demand during an erase or write operation in the EEPROM.

The Vpp voltage is typically applied to the word lines corresponding to the cell being erased, or written into, by way of decoder circuitry. In the past, these decoder circuits have typically drawn current from the Vpp supply even when the decoder was not addressing the word line. One such decoder of the prior art employed NOR gates in a pull-up mode. In such a configuration, a depletion pull-up transistor provides a signal path between the Vpp supply line and the word line to be selected. A plurality of enhancement transistors are connected between the word line and ground to provide a current sink path. When the corresponding word line is addressed, the gate terminals of the plurality of enhancement transistors are all set to a logic zero. This, disables all of the current sink paths and permits the word line to be pulled up to the Vpp level. However, as long as one of the gate terminals of the plurality of enhancement transistors is at a logic one, such as when the corresponding word line is not being selected, a current sink path is provided which sinks DC current from the Vpp supply.

As is clear from the above discussion, there exists a need for a method and apparatus for applying the internal Vpp to selected word lines such that word lines which are not selected do not draw current from the Vpp supply, and which minimize current demand from the Vpp supply in un-selected word lines.

DESCRIPTION OF THE INVENTION

These and other problems and limitations of the prior art are overcome by the present invention of a method and apparatus for transferring a current-limited high voltage signal to a selected word line while minimizing transfer of such voltage to the word line when the word line is unselected in a device which provides a pump signal having an incrementing portion and a charging portion during a write cycle of the device. The apparatus includes means connected between the word select line and responsive to the pump signal for generating a control signal, which control signal increases in magnitude by a predetermined amount during each incrementing portion of the pump signal; and means responsive to the control signal and connected between the high level source and the word select line for providing a signal path therebetween whenever the magnitude of the difference between the control signal and the signal level on the word line exceeds a predetermined threshold level. As the control signal is incrementally increased, the signal path means provides the signal path between the high level source and the word select line until the word select line rises to a level where the difference between the control signal and word select line level falls below the predetermined threshold voltage. On the next incremental increase of the control signal, the signal path is, again, provided by the signal path means and the word select line again rises to a next higher level. In this manner, the voltage on the word select line is increased incrementally over a period of time to the desired high voltage level.

Means are included within the control signal generating means so that when a particular word select line is not selected, the signal path between the high voltage source and the particular word select line is disabled.

It is therefore an object of the present invention to provide a method and apparatus for transferring an internally generated high voltage, current limited signal to selected word lines within an EEPROM device, while minimizing the voltage transfer to non-selected word lines.

It is another object of the present invention to provide a charge pump by which a high voltage, current-limited signal can be transferred to a selected load wherein said transfer is accomplished over a period of time and with an incrementally increasing signal level.

It is a further object of the present invention to provide a method and apparatus in which a signal path between an internal high voltage, current-limited source and a selected word line is provided, wherein such current path is controlled in accordance with a magnitude of a control signal, which magnitude is incremented over a period of time so that the high voltage signal is gradually supplied to and gradually builds up on the selected word line.

These and other objectives, features and advantages of the present invention will be more readily understood upon consideration of the following detailed description of certain preferred embodiments of the present invention and acccompanying drawings.

DETAILED DESCRIPTION OF THE DRAWINGS

Figure 1:
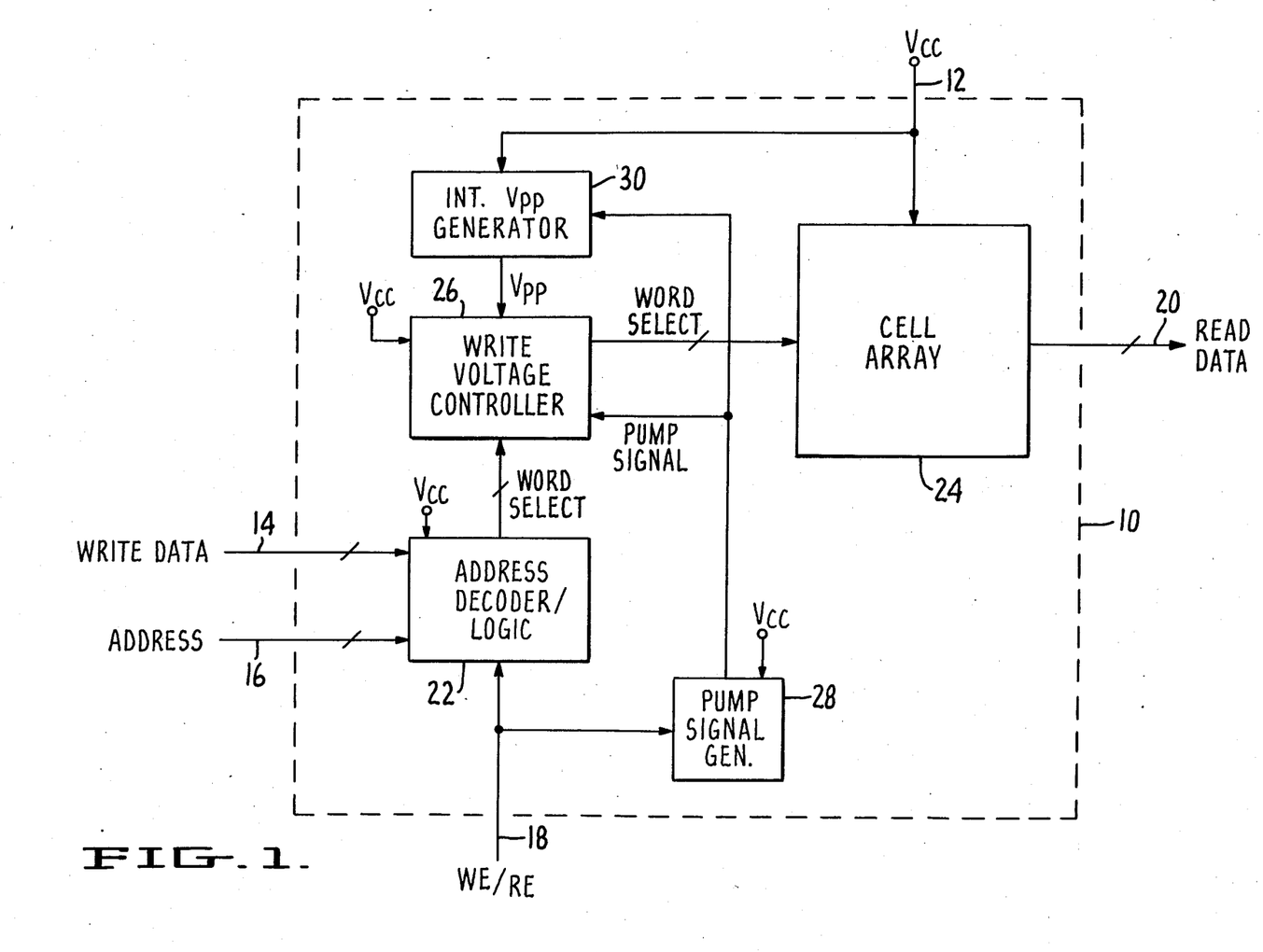
FIG. 1 illustrates the inter-relationship of the present invention with the typical functional blocks of an EEPROM.

FIG. 1 illustrates the relationship of the present invention to the functional components of a typical EEPROM 10. The EEPROM 10 receives supply voltage Vcc on line 12, write data on line 14, addressing on line 16, a write/read-enable control signal on line 18, and provide read data on line 20. Alternatively, lines 14 and 20 can be combined with appropriate internal multiplexing to serve as both a read and write data line.

Within the EEPROM 10, the write data and address information are received by address decoder/logic circuitry 22 which decodes the address and write data and enables appropriate write select lines to address the desired locations in the memory cell array 24. The write select information from address decoder/logic 22 is supplied to write voltage controller 26. The write/read-enable signal is received by address decoder logic and pump signal generator circuit 28.

When the write/read-enable signal is in a write enable state, the address decoder/logic circuit 22 analyzes the write data and address data and enables the appropriate write select lines to: (1) apply Vpp to all of the memory cells addressed to erase the addressed memory cells and, (2) apply Vpp to the memory cells indicated by the write data to write the appropriate logic levels therein.

When the write/read enable signal is in a read-enable state, the decoder/logic circuit 22 analyzes the address information supplied to it to enable the appropriate select lines by applying Vcc to them.

Write voltage controller 26 embodies the teachings of the present invention. Write voltage controller 26 receives Vpp from internal Vpp generator 30, Vcc from line 12, the word select signals from address decoder logic 22, and a pump signal from pump signal generator 28. In response to the word select signals from address decoder logic circuit 22 and the presence of the pump signal, write voltage controller 26 applies Vpp to the appropriate word select lines of the cell array 24.

As can be seen from FIG. 1, pump signal generator 28 receives the write/read enable signal from line 18. When a write enable state is presented, pump signal generator 28 generates the pump signal. The pump signal from the generator 28 is a free running oscillator which is disabled during the read mode. The pump signal from the generator 28 typically operates at one (1) MHz, which is a relative slow rate. By operating at a relative slow rate, the walk-out at node B (shown in FIG. 2), or the breakdown voltage variation can be minimized. As is also apparent from FIG. 1, all of the elements shown therein are powered from Vcc on line 12.

Internal Vpp generator 30 receives Vcc from line 12 and the pump signal from pump signal generator 28 to generate Vpp. Internal generation of Vpp is well known in the art.

Figure 2:
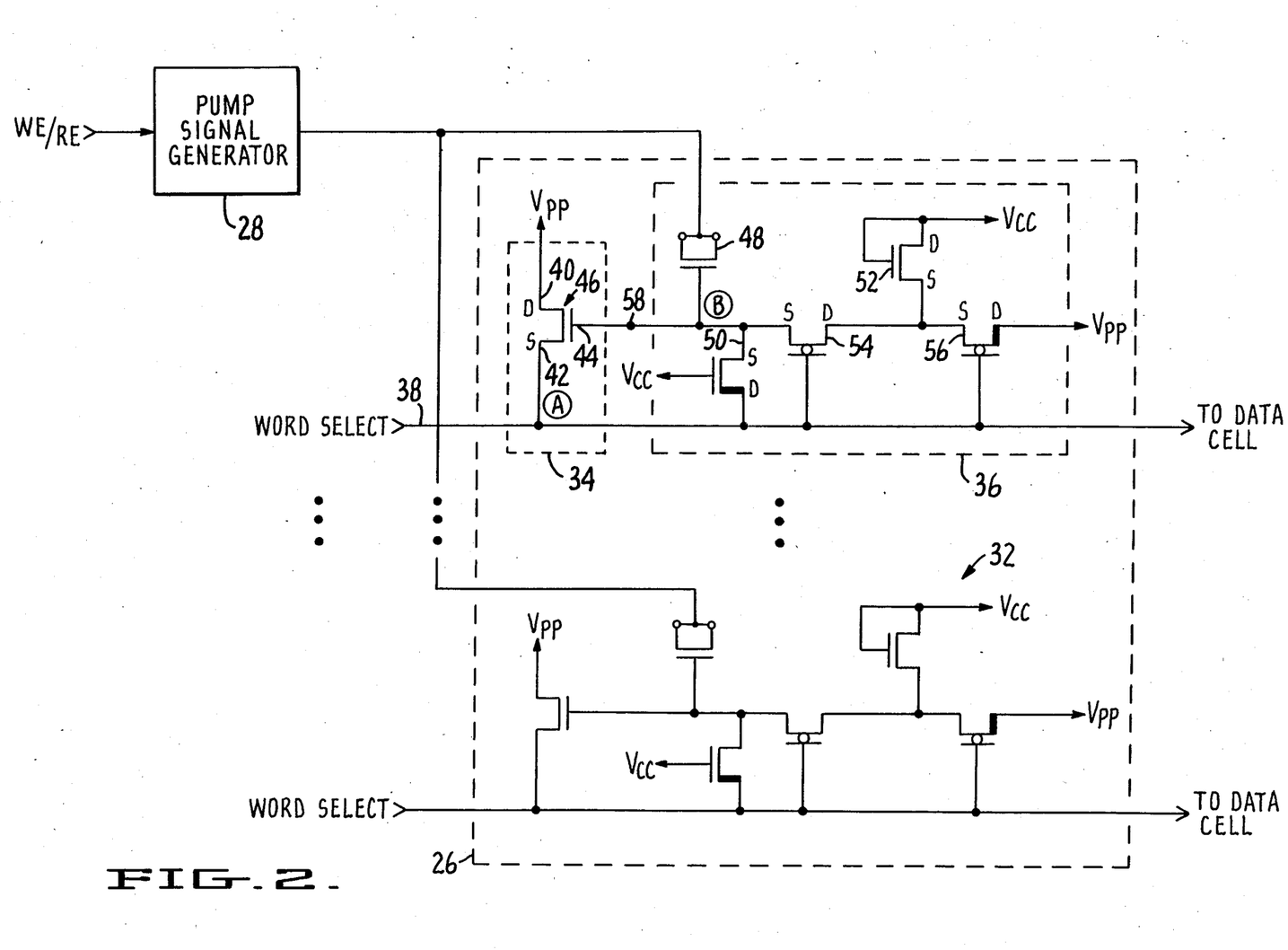
FIG. 2 is a simplified schematic of the present invention as implemented to transfer Vpp to a selected word line.

Referring to FIG. 2, the write voltage controller circuit 26 will be discussed in greater detail. The write voltage controller circuit 26 comprises a number of charge pump circuits 32. It is envisioned that each word select line of the cell array would have a corresponding charge pump. Alternatively, a central bank of charge pumps would be provided with appropriate switching to connect the output of each charge pump to the selected word select line. As shown in FIG. 2, the embodiment wherein each word select line of the cell array 24 has a charge pump associated with it is shown.

As discussed above, it is desirable that means be provided which permit Vpp to be transferred to the appropriate word select line, when the word select line has been selected, which prevents the transfer of Vpp to unselected word select lines. The charge pump 32 of the present invention provides such means.

The charge pump 32 of the present invention includes a controllable signal path 34 between Vpp and a corresponding word select line. Also provided is a generator circuit 36 which generates a control signal by which the signal path 34 is controlled.

The generator circuit 36 receives the pump signal from pump signal generator 28, receives Vcc from line 12, and is connected to internal Vpp generator 30 and to the corresponding word select line 38. The control signal provided by generator circuit 36 disables signal path 34 when word select line 38 is unselected, and provides a magnitude which is incremented over a period of time when the word select line 38 has been selected.

Signal path 34 has an input terminal 40, an output terminal 42, and a control terminal 44. In one embodiment of the present invention, signal path 34 is voltage controlled such that a signal path is provided between input terminal 40 and output terminal 42 when the difference in voltage levels between control terminal 44 and output terminal 42 exceeds a threshold voltage level. In this embodiment, the generator circuit 36 provides a control signal having a voltage level which increases incrementally in magnitude. With each increase in magnitude the signal path 34 is enabled so as to permit current flow from Vpp to the word select line 38. In turn, this causes the voltage level on word select line 38 to rise toward Vpp. The signal path 34 is disabled when the voltage level on word select line 38 approaches that of the control signal on control terminal 44 such that the voltage difference between control terminal 44 and output terminal 42 is less than the threshold voltage level. On the next increase in magnitude of the control signal, signal path 34 is again enabled to permit word select line 38 to rise in voltage level toward Vpp. In this manner, word select line 38 is gradually and incrementally brought up to the Vpp voltage level.

In the preferred embodiment of the present invention, signal path 34 and generator circuit 36 are implemented using metal oxide semiconductor field effect transistor devices (MOSFETs). It is to be understood that the present invention is not limited to implementation using MOSFETs, but that junction field effect transistors (JFETs), bipolar transistors and other similar technologies can be utilized to implement the teachings of the present invention.

Returning to the preferred embodiment of the present invention, signal path 34 is provided by an enhancement mode MOSFET 46. The drain of MOSFET 46 is connected to Vpp while its source is connected to word select line 38.

Generator circuit 36 includes an enhancement mode MOS capacitor 48, two enhancement mode MOSFETs 50 and 52, and two unimplanted MOSFETs 54 and 56. One terminal of capacitor 48 receives the pump signal from pump signal generator 28. The other end of capacitor 48 is tied to the source of MOSFET 50, the source of MOSFET 54 and to the output line 58 of generator circuit 36. The drain of MOSFET 50 is tied to word select line 38, while the gate thereof is connected to Vcc. The gate of MOSFET 54 is connected to word select line 38, while the drain thereof is connected to the source of MOSFET 56 and the source of MOSFET 52. The gate of MOSFET 56 is connected to word select line 38, while the drain thereof is connected to Vpp. The gate and drain of MOSFET 52 are tied together and connected to Vcc.

By way of background, an enhancement mode MOSFET provides a signal path between its drain and source whenever the voltage across its gate and source is at least approximately one volt. Depletion mode MOSFETs have a threshold voltage (gate-to-source), Vt, approximately minus two to three volts. Finally, unimplanted MOSFETs provide a signal path between drain and source when the gate-to-source voltage is approximately zero volts or greater.

Charge Pump Operation—Word Select Line Not Selected

Generator circuit 36 provides a control signal of zero volts to MOSFET 46 when word select line is in an unselected, i.e., logic zero, condition. Because MOSFET 46 is an enhancement mode device, a gate-to-source voltage of at least one volt is required before it will provide a signal path between Vpp and word select line 38. When word select line is at a zero volts, i.e., logic zero level, MOSFET 52, 56 and 54 keep the control signal at approximately zero volts.

MOSFET 52 maintains the source of MOSFET 56 at approximately Vcc minus one volt. Recall that MOSFET 52 is an enhancement mode device so that the gate-to-source threshold voltage is approximately one volt. Thus, the source of MOSFET 52 is at approximately Vcc minus one volt. Since the word line 38 is unselected, it is at zero volts. Thus, the gate-to-source voltage on MOSFET 56 will be less than zero volts and the device will be disabled. Thus, no current flow will be permitted from Vpp to MOSFET 54. With the gate of MOSFET 54 at zero volts, the source thereof will have a voltage of zero volts. This, in turn, will maintain the gate-to-source voltage or MOSFET 46 below the required threshold level.

Recall that MOS capacitor 48 is an enhancement mode device. Thus MOS capacitor 48 has a conducting threshold of approximately one volt. As shown in FIG. 2, MOS capacitor 48 is formed by tying the drain and source of an enhancement mode device together to form one terminal of the capacitor, while using the gate as the other terminal of the device. The drain/source terminal of MOS capacitor 48 receives the pump signal, while the gate terminal is tied to the sources of MOSFETs 50 and 54, and to the gate of MOSFET 46. In such a configuration, the gate to drain/source voltage of the MOS capacitor 48 is required to exceed approximately one volt before the MOS capacitor will conduct. Preferably, the pump signal from pump signal generator 28 varies between zero volts and Vcc. Hereinafter, the zero volt portion of the pump signal will be referred to as the "charging portion", while the Vcc portion of the pump signal will be referred to as the "incrementing portion".

When the source of MOSFET 54 is at zero volts, the gate of MOS capacitor 48 will be at zero volts. In this condition, MOS capacitor 48 will be nonconductive for all portions of the pump signal. This is because the gate-to-drain/source voltage, where the polarity of the gate-to-drain/source voltage is taken from gate-to-drain/source, never reaches the threshold level. Thus, the pump signal will not be coupled through MOS capacitor 48 to the gate of the MOSFET 46.

When word select line 38 is at zero volts, the drain of MOSFET 50 will be at zero volts. Recall that the source of MOSFET 50 is also at zero volts.

Thus, when a particular word select line is in an unselected condition, no current will be drawn from Vpp by the associated current pump for that word select line.

Charge Pump Operation—Word Line Selected

Figure 3:
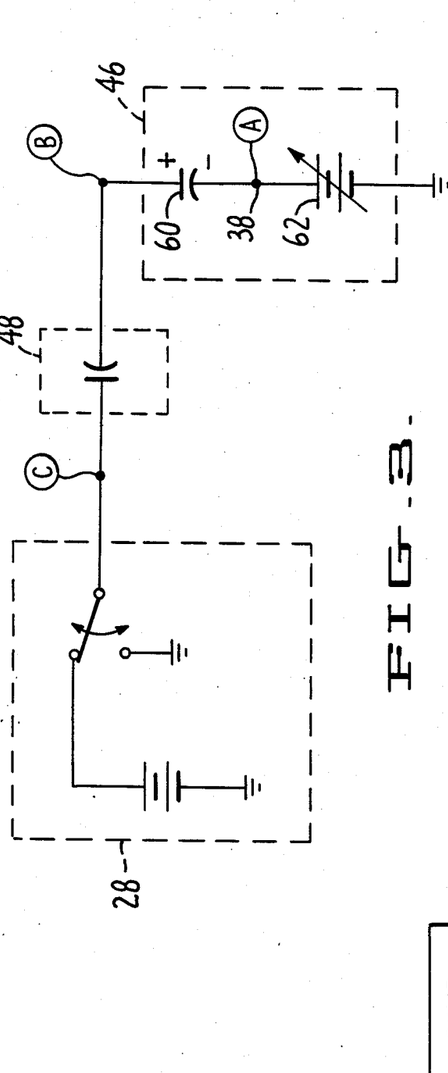
FIG. 3 is a functional-equivalent model of the charge pump of the present invention.

As also indicated above, the charge pump 32 of the present invention provides a write signal to a selected word select line which gradually increases toward Vpp. The manner in which this is accomplished by the circuitry shown in FIG. 2 will now be described in greater detail. Referring to FIG. 3, a functional equivalent diagram of the charge pump is shown. Pump signal generator 28 is seen to provide a signal which is switched between ground and Vcc. MOS capacitor 48 is seen to be a capacitor. The junction between MOS capacitor 48 and pump signal generator 28 is labelled as node C. The other end of MOS capacitor 48 is shown connected to node B. In FIG. 2, node B corresponds to the junction of the sources of MOSFETs 50 and 54, the gate of MOS capacitor 48 and the gate of MOSFET 46.

Returning to FIG. 3, a capacitor 60 is shown which corresponds to the gate-to-source capacitance of MOSFET 46. Capacitor 60 is connected between node B and a node A. Node A corresponds to the word select line 38. Finally, a variable voltage source 62 is shown connected between node A and ground. This variable source 62 corresponds to the voltage level on word select line 38. The voltage source 62 is shown to be variable as a function of the voltage across capacitor 60 to reflect the interaction of the gate-to-source voltage of MOSFET 46 with the voltage on word select line 38.

Figure 4:
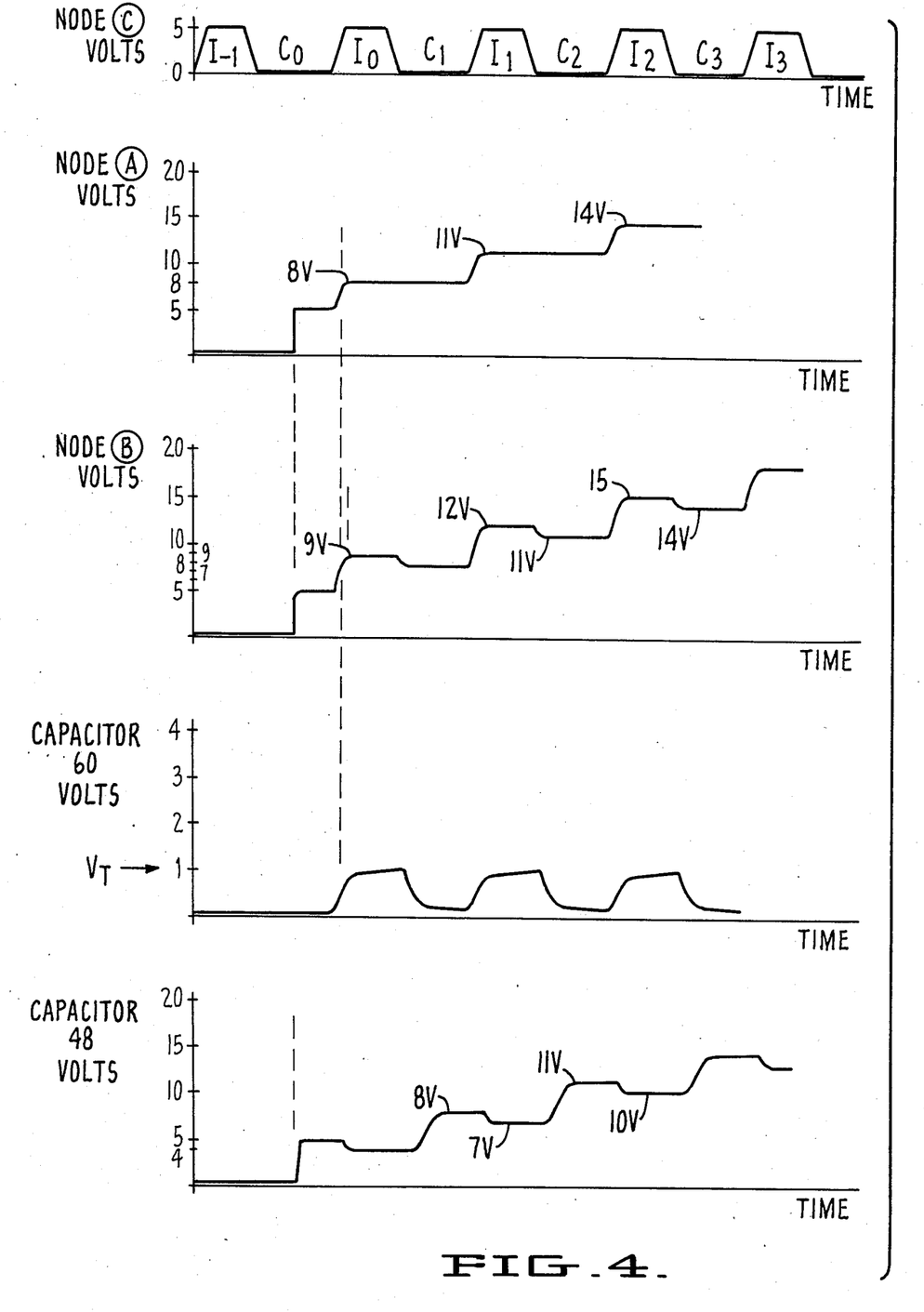
FIG. 4 is a timing diagram which illustrates the relative signal levels at selected points of the charge pump circuit of FIG. 2 and the functional diagram of FIG. 3.

FIG. 4 is a timing diagram which shows the voltage levels present at the various nodes and across MOS capacitor 48 and capacitor 60 when the control signal is being generated by generator 36.

For purposes of explanation, assume that Vcc is approximately five volts, that a logic one level corresponds to plus five volts, and that a logic zero level corresponds to zero volts. As such, the pump signal, shown in the curve for node C in FIG. 4, varies between zero and five volts. The incrementing portions of the pump signal are labelled with subscripted I's, while the charging portions are labelled with subscripted C's. For incrementing interval $I_{-1}$, the voltage on word select line 38 is assumed to be zero, i.e., word select line 38 is unselected. Thus, the voltage at node A is zero, and the voltage at node B is zero. Also, MOS capacitor 48 is non-conducting and has zero volts across it. Finally, with node B at zero volts and node A at zero volts, the voltage across capacitor 60 is zero.

During charging portion $C_0$, the word select line 38 is shown to be set to +5 volts. This shows up on the curve for node A. When this occurs, the drain of MOSFET 50 is at a voltage which is approximately equal to the voltage on its gate. Thus, MOSFET 50 conducts to cause its source to be at approximately four volts. Recall that MOSFET 50 is an enhancement mode device.

At approximately the same time, the gate of MOSFET 56 is at approximately five volts. Thus, the gate is raised to a voltage level greater than that of the source terminal thereof to permit a current path to be established between Vpp and the drain of MOSFET 54. Note that the gate of MOSFET 54 has also assumed a +5 level. As such MOSFET 54 provides a current path from Vpp to the gate of MOSFET 46 and to MOS capacitor 48 at a voltage level of approximately five volts. Recall that MOSFET 54 is an unimplanted device and, as such, has a threshold voltage of approximately zero volts. Thus, the source of MOSFET 54 will be at approximately the same voltage as the gate thereof.

MOSFET 50, thus, provides an initial push to raise node B to a point where MOS capacitor 48 and MOSFET 46 are in a conducting condition. Thereafter, MOSFET 50 is no longer conducting and MOSFET 54 takes over to increase the voltage at node B to approximately five volts.

During charging portion C0, it can be seen, from FIG. 4, that the voltage across capacitor 60, i.e., the gate source capacitance of MOSFET 46, is still below the threshold level, and, as such, MOSFET 46 is nonconducting.

Conversely, it can be seen that the voltage across MOS capacitor 48 charges towards five volts. The curve for the voltage across capacitor 48 is taken from node B to node C.

During incrementing portion $I_0$ of the curve for node C, node B is shown to increase to approximately nine volts. This is because the polarity of the voltage on MOS capacitor 48 is additive with respect to the +5 volt magnitude of the pump signal at node C.

If it were assumed that the pump signal had infinite rise times therein, the waveform at node B would be instantaneously at nine volts upon initiation of incrementing portion $I_0$. However, since finite rise times are present in the pump signal, as can be seen in the curve for node C, a finite rise time is exhibited in the node B curve.

From the curve for the voltage across capacitor 60, it can be seen that as the voltage at node B increases toward +9 volts, the voltage across capacitor 60 also increases. It is to be noted that, if capacitor 60 were a true capacitor, there would be a voltage divider formed by the series combination of MOS capacitor 48 and capacitor 60. However, MOSFET 46 has a gate-to-source threshold of approximately one volt. Therefore, when the gate-to-source voltage reaches approximately one volt, MOSFET 46 will begin to conduct, which will cause the source thereof to rise in voltage level. As such, the voltage across capacitor 60 will have a maximum of approximately one volt when MOSFET 46 is conducting. Thus, the curve for capacitor 60 shows an increase to approximately one volt, i.e., the threshold of the gate-to-source voltage for MOSFET 46. During this time, it can be seen from the curve for capacitor 48 that the voltage across MOS capacitor 48 actually decreases. This is because a portion of the charge originally on MOS capacitor 48 is distributed to capacitor 60 as capacitor 60 charges up.

When the voltage across capacitor 60 reaches the threshold voltage $V_t$, curve for node A shows that MOSFET 46 begins to conduct so that the voltage at node A increases toward approximately eight volts. Note that the level at node A is approximately one volt below that at node B due to the threshold voltage of one volt for MOS device 46.

During charging portion $C_l$, the pump signal assumes a logic zero level. As such, the nine-volt level present at node B is impressed across MOS capacitor 48. As shown in the curve for capacitor 48, MOS capacitor 48 begins to charge from its original four-volt level to approximately eight volts. As MOS capacitor 48 charges toward eight volts, capacitor 60 discharges toward zero. During this discharge of capacitor 60, the gate-to-source voltage across MOSFET 54 will be negative, since the word select line is at approximately eight volts and node B was originally at approximately nine volts. Thus, MOSFET 54 is nonconducting during this time. However, when the voltage across capacitor 60 reaches approximately zero volts, the gate-to-source voltage of MOSFET 54 will be approximately zero volts, the threshold for the device. As such, MOSFET 54 will conduct to maintain node B at approximately eight volts, i.e. the voltage level present at node A. Thus, the curve for node B is shown to be at an eight-volt level and the voltage across MOS capacitor 48 is shown to be at approximately eight volts during charging portion $C_1$.

During the next incrementing portion, $I_1$, the sum of the pump signal and the voltage across MOS capacitor 48 is initially, approximately 13 volts. As before, capacitor 60 begins charging and drains away some of the charge from MOS capacitor 48 so that the steady state level at node B is less than 13 volts, and so that the steady state voltage across MOS capacitor 48 is less than its original eight-volt level. When capacitor 60 reaches a voltage of approximately one volt, MOSFET 46 begins conducting which causes node A to rise toward 11 volts. As before, node A is at a level one threshold voltage below the level of node B.

During charging portion C2, node C again goes to ground which causes 11 volts to be impressed across MOS capacitor 48. MOS capacitor 48 then begins charging toward 11 volts which causes capacitor 60 to discharge toward zero. When capacitor 60 reaches approximately zero volts, MOSFET 54 begins conducting to hold the level at node B at a level approximately equal to the level at node A.

The above-described incremental increase of the signal on node B, i.e., the control signal, and the resulting increase in the voltage level present at node A, continues until node A obtains a voltage level of approximately Vpp. Thus, the above-discussed configuration draws no current when it's associated word select line is not selected, and gradually increases the voltage level on its associated word select line when the word select line has been selected. This configuration minimizes the current drain demands upon the internal Vpp generation circuit 30.

In practice, it has been found that several hundred micro-seconds are required to raise a selected word select line to a 20-volt level using the above-discussed structure. The Fowler-Nordheim effect described above requires approximately ten milliseconds to be implemented. Therefore, the charging time requirement for the present invention is negligible with respect to the time required for the Fowler-Nordheim effect itself.

The teaching of the present invention can be implemented using the above structure without the use of MOSFET 52 and MOSFET 56. By using MOSFET 52 and MOSFET 56, it can be ensured that no current will flow from Vpp through MOSFET 54 when the word select line is unselected.

It is to be understood that the use of an enhancement, unimplanted, or depletion mode device in the positions indicated above, is not an absolute requirement for satisfactory functioning of the invention. For example, MOSFET 54 can be an enhancement mode device. However, as such, node B will be at a lower level during the charging portion of the invention operation.

Additionally, MOSFET 50 can be a depletion mode device with its gate connected to ground, and its drain connected to word select line 38. While the described structure assumes voltage thresholds associated with N type semiconductor material, it is envisioned that the present invention can be implemented using P type material with appropriate adjustment of the structure to take into account the difference in voltage thresholds for P type material.

It is also envisioned that the charge pump structure described above can be used as a basic building block for generation of the internal Vpp itself.

As is apparent from the discussion above, the teachings of the present invention are ideally suited for implementation as a part of the internal circuitry of an EEPROM. The minimal component count of the implementing structure shown in FIG. 2 minimizes the impact on chip size due to the addition of this circuitry. Furthermore, the components required for implementing the present invention are easily fabricated and require no special processes or large physical areas.

Figure 5:
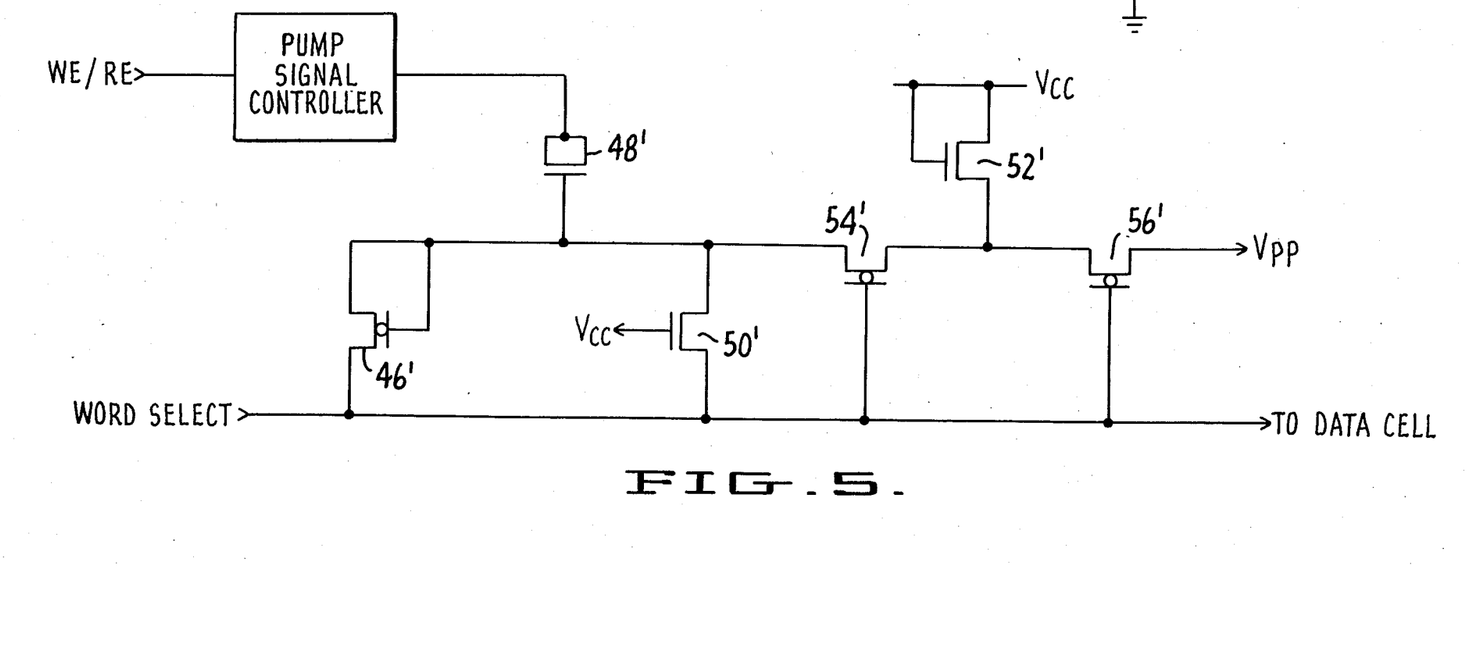
FIG. 5 shows an additional embodiment of the charge pump circuit.

Referring to FIG. 5 there is shown another embodiment of the charge pump 32 of the present invention. The charge pump 32 shown in FIG. 5 differs from the charge pump 32 shown in FIG. 2 only in that MOSFET 46 is a native or unimplanted transistor, with its gate connected to its drain.

In the charge pump 32 of FIG. 5, the pump signal has to overcome only the native threshold of MOSFET 46 and the native threshold of MOSFETS 54 and 56. In contrast, in the charge pump 32 of FIG. 2, the pump signal has to overcome the enhancement threshold of MOSFET 46 and the native threshold of MOSFETS 54 and 56. As a result, the pumping efficiency of the charge pump 32 of FIG. 5 is better than that of the pump of FIG. 2.

In accordance with the method of the present invention, the voltage from the high voltage, low current source is gradually transferred to the desired word select line. This is done by generating a control signal whose magnitude is incrementally increased over time, and providing a controllable signal path between the high voltage, low current source and the desired word select line which path is responsive to the control signal so that the signal path is provided whenever the difference between the control signal and the signal level on the word select line exceed a predetermined threshold level. In this manner, the signal on the word select line is incrementally increased toward the high voltage level, and the current demands on the high voltage, low current source are minimized. In order to generate the control signal, a pump signal is utilized which pump signal is provided during a write operation, and incrementing portions and charging portions. The generating step includes the step of charging a capacitor, during the charge portion of the pump signal, to a voltage level which is substantially equal to the then existing control signal level, and forming the control signal, during the incrementing portion of the pump signal, from the sum of the voltage across the capacitor means and the magnitude of the incrementing portion of the pump signal. During the charge portion of the pump signal, the method of the present invention also includes the step of maintaining the control signal at a level which is substantially equal to the signal level then present on the word select line.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

We claim:

1. An apparatus for applying a high voltage source to a word select line in an electrically eraseable programmable memory, the apparatus comprising:

means for generating a pump signal, said signal having an incrementing portion and a charging portion;

means responsive to the pump signal for generating a control signal wherein the control signal generating means increase the magnitude of the control signal by a predetermined amount during each incrementing portion of the pump signal; and means responsive to the control signal and coupled between the high voltage source and the word select line for providing a signal path between the high voltage source and the word select line to modify the signal level on the word select line whenever the magnitude of the difference between the control signal and the signal level on the word select line exceeds a predetermined threshold level, so that the signal level on the word select line increases incrementally to the magnitude of the high level source.

2. The apparatus of claim 1 wherein the signal path has a control terminal for receiving the control signal and further wherein the control signal generating means include:

capacitor means coupled to the control terminal and receiving the pump signal for generating an increment signal wherein the capacitor means charge to the then existing control signal magnitude during the charging portion of the pump signal, so that the control signal magnitude presented to the control terminal of the signal path means during a subsequent incrementing portion of the pump signal is substantially equal to the magnitude of the pump signal plus the magnitude of the control signal during the previous charging portion; and means coupled to the high level source, to the control terminal for maintaining the control terminal at a magnitude substantially equal to the then existing signal level on the word select line during the charging portion of the pump signal.

3. The apparatus of claim 2 wherein said control signal generating means being coupled to the word select line.

4. The apparatus of claim 3 wherein a first voltage level is provided on the word select line when the write signal is to be transferred to the word select line and a second voltage level is provided on the word select line whenever the write signal is not to be transferred to the word select line, and further wherein the capacitor means are non-conductive whenever the control signal is substantially no greater than the second voltage level, such that the maintaining means maintain the control signal at a level substantially equal to the second voltage level whereby the capacitor means are disabled when the second voltage level is supplied on the word select line.

5. The apparatus of claim 4 wherein the signal path means are transistor means having an input terminal connected to the high level source, an output terminal connected to the word select line, and a control input which receives the control signals from the generating means, whereby a conductive path is formed between the input and the output terminals whenever the magnitude of the control signal exceeds the magnitude of the word select signal by the predetermined threshold level.

6. The apparatus of claim 5 wherein the transistor means are field effect transistors.

7. The apparatus of claim 6 wherein the field effect transistors are metal oxide semiconductor field effect transistors.

8. The apparatus of claim 3 wherein the maintaining means include transistor means having an input terminal connected to the high level source, an output terminal connected to the control terminal input of the signal path means, and a control input connected to the word select line and responsive to the signal level on the word select line for forming a signal path between the high level source and the control terminal of the signal path means whenever the control signal magnitude falls below the magnitude of the signal level then existing on the word select line.

9. The apparatus of claim 8 wherein the transistor means are field effect transistors.

10. The apparatus of claim 9 wherein the field effect transistors are metal oxide semiconductor field effect transistors.

11. The apparatus of claim 4 wherein the capacitor means comprise a metal oxide semiconductor capacitor.

12. The apparatus of claim 4 further including initiating means coupled to the control terminal of the signal path means and to the word select line for coupling the word select line to the control terminal of the signal path means whenever the first voltage level is presented on the word select line so that the capacitor means are placed in a conductive state.

13. The apparatus of claim 12 wherein the initiating means include transistor means having an input terminal connected to the word select line, an output terminal connected to the control terminal of the signal path means, and a control input which is maintained at the first voltage level, so that a conductive path is formed between the input and output terminals whenever the signal level on the input terminal is substantially equal to the first voltage level.

14. An apparatus for controlling the application of an internal high voltage from an internal high voltage source to a word select line in an electrically eraseable programmable read-only memory, the apparatus being supplied with a pump signal having an increment portion and a charge portion which is generated during an erase or write cycle, the apparatus comprising:

first field effect transistor means having a drain terminal coupled to the internal high voltage source, a source terminal coupled to the word select line, and a gate terminal, for providing a current path between the high level source and the word select line;

capacitor means having a first terminal coupled to the gate terminal of the first field effect transistor means, and a second terminal which receives the pump signal, for charging to a voltage substantially equal to the signal level on the word select signal during the charge portion of the pump signal, and for presenting a control signal to the gate terminal of the first field effect transistor means having a magnitude which substantially equals the sum of the magnitude of the increment portion of the pump signal and the magnitude of the signal level on the word select line during the previous charge portion of the pump signal; and second field effect transistor means having a drain terminal coupled to the internal high voltage source, a source terminal coupled to the gate terminal of the first field effect transistor means, and a gate terminal coupled to the word select line, for maintaining the gate terminal at approximately the signal level on the word select line during the charge portion of the pump signal to permit the capacitor means to charge to the signal level on the word select line during the charge portion of the pump signal whereby the control signal magnitude increases with each increment portion of the pump signal, and the signal level on the word select line increases incrementally to the internal high voltage level.

15. The apparatus of claim 14 wherein the second field effect transistor means has a gate to source threshold voltage of approximately zero volts and further wherein the capacitor means are non-conductive when the voltage drop from the first terminal to the second terminal is less than a predetermined conducting threshold.

16. The apparatus of claim 15 wherein the electrically erasable programmable read-only memory applies a logic zero level to the word select line when application of the high voltage to the word select line is not desired, and applies a logic one level to the word select line when application of the high voltage to the word select line is desired, further including third field effect transistor means having a drain terminal coupled to the word select line, a source terminal coupled to the first terminal of the capacitor means and a gate terminal which is maintained at the logic one level, and having a predetermined gate-to-source terminal threshold for providing a signal path between the word select line and the first terminal of the capacitor means whenever the signal level on the word select line is greater than or equal to a logic one level, so that the capacitor means are conductive whenever the signal level on the word select line is greater than or equal to a logic one level.

17. A method for controlling the transfer of a signal from a high voltage source to a word select line in an electrically erasable programmable read-only memory, the method comprising the steps of:

generating a pump signal during an erase or write operation, the pump signal having increment portions and charge portions;

generating a control signal which increases in magnitude as a function of the pump signal;

providing a signal path between the high voltage source and the word select line whenever the difference in magnitude of the control signal and the signal level on the word select line exceed a predetermined threshold level.

18. The method of claim 17 wherein the control signal generating step include the steps of:

maintaining the control signal at a level substantially equal to the signal level on the word select line during the charge portion of the pump signal; and increasing the magnitude of the control signal by a pre-determined increment during the increment portion of the pump signal.

* * * * *